United States Patent
Seong et al.

(10) Patent No.: US 11,264,844 B2
(45) Date of Patent: Mar. 1, 2022

(54) APPARATUS AND METHOD FOR MEASURING VEHICLE POSITION BASED ON LOW FREQUENCY SIGNALS

(71) Applicants: Hyundai Motor Company, Seoul (KR); Kia Motors Corporation, Seoul (KR)

(72) Inventors: Jae Yong Seong, Gyeonggi-do (KR); Min Byeong Lee, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 177 days.

(21) Appl. No.: 16/669,037

(22) Filed: Oct. 30, 2019

(65) Prior Publication Data

US 2020/0136439 A1  Apr. 30, 2020

(30) Foreign Application Priority Data

Oct. 31, 2018 (KR) .......................... 10-2018-0131788
Oct. 15, 2019 (KR) .......................... 10-2019-0128043

(51) Int. Cl.
*H02J 50/90* (2016.01)
*H04B 17/318* (2015.01)
(Continued)

(52) U.S. Cl.
CPC .............. *H02J 50/90* (2016.02); *B60L 5/005* (2013.01); *B60L 53/126* (2019.02); *B60L 53/36* (2019.02); *H02J 50/12* (2016.02); *H04B 17/318* (2015.01)

(58) Field of Classification Search
CPC .. H02J 50/90; H02J 50/12; H02J 50/10; H02J 50/00; H04B 17/00; B60L 50/12; B60L 53/126; B60L 53/35–53/39; B60L 5/005; B60L 53/124; G01R 33/0206; G01R 33/02; G01R 33/20
(Continued)

(56) References Cited

U.S. PATENT DOCUMENTS

2012/0286730 A1* 11/2012 Bonny .................... B60L 53/35
                                                    320/109
2015/0298558 A1* 10/2015 Lewis .................... B60L 53/65
                                                     701/22

(Continued)

FOREIGN PATENT DOCUMENTS

EP      2 921 376 A1    9/2015
WO   2016/014294 A1    1/2016

*Primary Examiner* — Hal Kaplan
*Assistant Examiner* — Swarna N Chowdhuri
(74) *Attorney, Agent, or Firm* — Mintz Levin Cohn Ferris Glovsky and Popeo, P.C.; Peter F. Corless

(57) ABSTRACT

A position alignment method performed by a ground assembly for wireless power transfer includes measuring, through at least one low frequency ("LF") receiver of the ground assembly, a first magnetic flux density for a magnetic field emitted from at least one LF transmitter of a vehicle assembly; measuring, through the at least one LF receiver, a second magnetic flux density for a magnetic field emitted from the at least one LF transmitter; configuring a received signal measurement based on a comparison result of the first magnetic flux density and the second magnetic flux density; and providing the configured received signal measurement to a vehicle.

17 Claims, 12 Drawing Sheets

(51) Int. Cl.
*H02J 50/12* (2016.01)
*B60L 53/126* (2019.01)
*B60L 53/36* (2019.01)
*B60L 5/00* (2006.01)

(58) Field of Classification Search
USPC .................................................. 340/933, 934
See application file for complete search history.

(56) References Cited

U.S. PATENT DOCUMENTS

2017/0111088 A1* 4/2017 Seong ..................... H02J 50/10
2017/0361725 A1* 12/2017 Seong ................... H04B 5/0037
2018/0178659 A1* 6/2018 Berger .................... B60L 53/36

\* cited by examiner

APPARATUS AND METHOD FOR MEASURING VEHICLE POSITION BASED ON LOW FREQUENCY SIGNALS

CROSS-REFERENCES TO RELATED APPLICATIONS

This application claims under 35 U.S.C. § 119(a) the benefit of Korean Patent Applications No. 10-2018-0131788 filed on Oct. 31, 2018 and No. 10-2019-0128043 filed on Oct. 15, 2019 in the Korean Intellectual Property Office (KIPO), the entire contents of which are incorporated herein by reference.

BACKGROUND

(a) Technical Field

The present disclosure relates to a method for measuring a position for wireless charging and an apparatus using the same, amore particularly, to the method for measuring the position by using low frequency (LF) signals, and the apparatus using the same.

(b) Description of the Related Art

An electric vehicle (EV) drives an electric motor by power of a battery, and produces less air pollution such as exhaust gas and noise compared with a conventional gasoline engine vehicle, and has other benefits such as a longer life and simplified operation thereof.

EVs are classified into hybrid electric vehicles (HEVs), plug-in hybrid electric vehicles (PHEVs), and electric vehicles (EVs), depending on a driving source. The HEV has an engine as a main power source and a motor as an auxiliary power source. The PHEV has a main power motor and an engine used when a battery is discharged. The EV has a motor, but it does not have an engine.

Wireless charging of the battery for driving the electric motor of the EV may be performed by coupling a primary coil of a charging station with a secondary coil of the EV in a magnetic resonance manner. Additionally, in a magnetic resonance wireless power transfer (WPT) system, if the primary and secondary coils are not aligned, the efficiency of the WPT may be reduced substantially. Therefore, the alignment of the primary coils and the secondary coils is required.

As a conventional alignment scheme, there is a technique of aligning an EV equipped with a secondary coil to a primary coil of a ground assembly (GA) using a rear camera. Another technique involves moving a movable charging pad after an EV is parked in a parking area by a bump to align a primary coil of the charging pad with a secondary coil of the EV.

However, such conventional techniques may require a user's intervention in the alignment of the coils, and thus inconvenience due to the user's intervention, and result in a substantial deviation of the alignment, which may lead to excessive system performance deterioration due to slight coil misalignment. Therefore, in the magnetic resonance WPT system sensitive to the misalignment of the coils, it is difficult to realize optimal power transfer efficiency, and the stability and reliability of the system may be deteriorated.

Accordingly, there is a need for a method of accurately measuring or estimating the position of a vehicle for alignment between a ground assembly of a charging station and a vehicle assembly of the vehicle in the WPT system.

SUMMARY

The present disclosure provides a position alignment method for wireless power transfer, which is performed in a ground assembly. Additionally, the present disclosure provides a position measurement apparatus for wireless power transfer, which is performed in a vehicle assembly. Additionally, the present disclosure provides a position measurement apparatus using the position measurement method.

According to exemplary embodiments of the present disclosure, a position alignment method performed by a GA for wireless power transfer may comprise measuring, through at least one LF receiver of the GA, a first magnetic flux density for a magnetic field emitted from at least one LF transmitter of a vehicle assembly (VA); measuring, through the at least one LF receiver, a second magnetic flux density for a magnetic field emitted from the at least one LF transmitter; configuring a received signal measurement based on a comparison result of the first magnetic flux density and the second magnetic flux density; and providing the configured received signal measurement to a vehicle.

The first magnetic flux density may be a maximum magnetic flux density for the magnetic field emitted from the at least one LF transmitter, and the second magnetic flux density may be a minimum magnetic flux density for the magnetic field emitted from the at least one LF transmitter.

The configuring of the received signal measurement may comprise determining whether a difference between the first magnetic flux density and the second magnetic flux density is greater than or equal to a threshold; and excluding the first magnetic flux density and the second magnetic flux density from the received signal measurement when the difference between the first magnetic flux density and the second magnetic flux density is less than the threshold.

The received signal measurement may be a received signal strength indicator (RSSI).

The first magnetic flux density and the second magnetic flux density may be measured at different time points by the at least one LF receiver.

The position alignment method may further comprise initially detecting a magnetic field emitted from the at least one LF transmitter of the VA.

Further, according to exemplary embodiments of the present disclosure, a position measurement method performed by a VA for wireless power transfer may comprise emitting a magnetic field having a first magnetic flux density through at least one LF transmitter; emitting a magnetic field having a second magnetic flux density through the at least one LF transmitter; receiving a received signal measurement from a GA that detects the first magnetic flux density and the second magnetic flux density; and calculating a distance between the VA and the GA based on the received signal measurement.

The first magnetic flux density may be a maximum magnetic flux density for the magnetic field emitted from the at least one LF transmitter, and the second magnetic flux density may be a minimum magnetic flux density for the magnetic field emitted from the at least one LF transmitter.

The received signal measurement may include only data related to the first magnetic flux density and the second magnetic flux density which have a difference equal to or greater than a threshold.

The received signal measurement may be an RSSI.

The first magnetic flux density and the second magnetic flux density may be emitted at different time points.

The position measurement method may further comprise initially emitting a magnetic field through the at least one LF transmitter.

Further, according to exemplary embodiments of the present disclosure, a position measurement apparatus may comprise at least one low frequency (LF) transmitter; a communication module configured to receive a received signal measurement from a ground assembly (GA) that detects the first magnetic flux density and the second magnetic flux density; and a processor configured to control the LF transmitter to emit a magnetic field having a first magnetic flux density and to emit a magnetic field having a second magnetic flux density, and calculate a distance between a vehicle assembly (VA) and the GA based on the received signal measurement.

The first magnetic flux density may be a maximum magnetic flux density for the magnetic field emitted from the at least one LF transmitter, and the second magnetic flux density may be a minimum magnetic flux density for the magnetic field emitted from the at least one LF transmitter.

The received signal measurement may include only data related to the first magnetic flux density and the second magnetic flux density which have a difference equal to or greater than a threshold.

The received signal measurement may be an RSSI.

The first magnetic flux density and the second magnetic flux density may be emitted at different time points.

The processor may be further configured to initially emit a magnetic field through the at least one LF transmitter.

The first magnetic flux density and the second magnetic flux density may be measured for each magnetic field emitted by the at least one LF transmitter by each of at least one LF receiver of an electric vehicle supply equipment (EVSE).

The LF receiver may be an LF antenna or an LF sensor.

According to the exemplary embodiments of the present disclosure, by accurately measuring the position of the vehicle using the LF signals, the primary coil of the ground assembly and the secondary coil of the electric vehicle can be precisely aligned, thereby maximizing wireless charging efficiency.

BRIEF DESCRIPTION OF DRAWINGS

The present disclosure will become more apparent by describing in detail exemplary embodiments of the present disclosure with reference to the accompanying drawings, in which.

Figure 1:
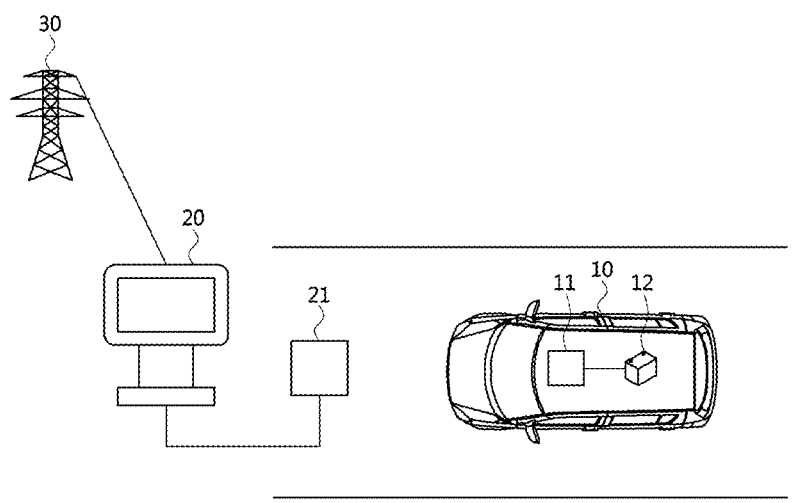
FIG. 1 is a conceptual diagram illustrating a concept of a wireless power transfer (WPT) to which exemplary embodiments of the present disclosure are applied.

It should be understood that the above-referenced drawings are not necessarily to scale, presenting a somewhat simplified representation of various features illustrative of the basic principles of the disclosure. The specific design features of the present disclosure, including, for example, specific dimensions, orientations, locations, and shapes, will be determined in part by the particular intended application and use environment.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like.

Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Embodiments of the present disclosure are disclosed herein. However, specific structural and functional details disclosed herein are merely representative for purposes of describing exemplary embodiments of the present disclosure, however, exemplary embodiments of the present disclosure may be embodied in many alternate forms and should not be construed as limited to exemplary embodiments of the present disclosure set forth herein. While describing the respective drawings, like reference numerals designate like elements.

It will be understood that although the terms "first," "second," etc. may be used herein to describe various components, these components should not be limited by these terms. These terms are used merely to distinguish one element from another. For example, without departing from the scope of the present disclosure, a first component may be designated as a second component, and similarly, the second component may be designated as the first component.

It will be understood that when a component is referred to as being "connected to" another component, it can be directly or indirectly connected to the other component. That is, for example, intervening components may be present. On the contrary, when a component is referred to as being "directly connected to" another component, it will be understood that there is no intervening components.

All terms including technical or scientific terms, unless being defined otherwise, have the same meaning generally understood by a person of ordinary skill in the art. It will be understood that terms defined in dictionaries generally used are interpreted as including meanings identical to contextual meanings of the related art, unless definitely defined otherwise in the present specification, are not interpreted as being ideal or excessively formal meanings.

Additionally, it is understood that one or more of the below methods, or aspects thereof, may be executed by at least one controller. The term "controller" may refer to a hardware device that includes a memory and a processor. The memory is configured to store program instructions, and the processor is specifically programmed to execute the program instructions to perform one or more processes which are described further below. The controller may control operation of units, modules, parts, devices, or the like, as described herein. Moreover, it is understood that the below methods may be executed by an apparatus comprising the controller in conjunction with one or more other components, as would be appreciated by a person of ordinary skill in the art.

According to exemplary embodiments of the present disclosure, an EV charging system may be defined as a system for charging a high-voltage battery mounted in an EV using power of an energy storage device or a power grid of a commercial power source. The EV charging system may have various forms according to the type of EV. For example, the EV charging system may be classified as a conductive-type using a charging cable or a non-contact wireless power transfer (WPT)-type (also referred to as an "inductive-type"). The power source may include a residential or public electrical service or a generator utilizing vehicle-mounted fuel, and the like.

Additional terms used in the present disclosure are defined as follows.

"Electric Vehicle (EV)": An automobile, as defined in 49 CFR 523.3, intended for highway use, powered by an electric motor that draws current from an on-vehicle energy storage device, such as a battery, which is rechargeable from an off-vehicle source, such as residential or public electric service or an on-vehicle fuel powered generator. The EV may be a four or more wheeled vehicle manufactured for use primarily on public streets or roads.

The EV may include an electric vehicle, an electric automobile, an electric road vehicle (ERV), a plug-in vehicle (PV), a plug-in vehicle (xEV), etc., and the xEV may be classified into a plug-in all-electric vehicle (BEV), a battery electric vehicle, a plug-in electric vehicle (PEV), a hybrid electric vehicle (HEV), a hybrid plug-in electric vehicle (HPEV), a plug-in hybrid electric vehicle (PHEV), etc.

"Plug-in Electric Vehicle (PEV)": An EV that recharges the on-vehicle primary battery by connecting to the power grid.

"Plug-in vehicle (PV)": An electric vehicle rechargeable through wireless charging from an electric vehicle supply equipment (EVSE) without using a physical plug or a physical socket.

"Heavy duty vehicle (H.D. Vehicle)": Any four-or more wheeled vehicle as defined in 49 CFR 523.6 or 49 CFR 37.3 (bus).

"Light duty plug-in electric vehicle": A three or four-wheeled vehicle propelled by an electric motor drawing current from a rechargeable storage battery or other energy devices for use primarily on public streets, roads and highways and rated at less than 4,545 kg gross vehicle weight.

"Wireless power charging system (WCS)": The system for wireless power transfer and control between the GA and VA including alignment and communications. This system transfers energy from the electric supply network to the electric vehicle electromagnetically through a two-part loosely coupled transformer.

"Wireless power transfer (WPT)": The transfer of electrical power from the alternating current (AC) supply network to the electric vehicle by contactless means.

"Utility": A set of systems which supply electrical energy and may include a customer information system (CIS), an advanced metering infrastructure (AMI), rates and revenue system, etc. The utility may provide the EV with energy through rates table and discrete events. Additionally, the utility may provide information about certification on EVs, interval of power consumption measurements, and tariff.

"Smart charging": A system in which EVSE and/or PEV communicate with power grid to optimize charging ratio or discharging ratio of EV by reflecting capacity of the power grid or expense of use.

"Automatic charging": A procedure in which inductive charging is automatically performed after a vehicle is located in a proper position corresponding to a primary charger assembly that can transfer power. The automatic charging may be performed after obtaining necessary authentication and right.

"Interoperability": A state in which components of a system interwork with corresponding components of the system in order to perform operations aimed by the system. Additionally, information interoperability may refer to capability that two or more networks, systems, devices, applications, or components may efficiently share and easily use information without causing inconvenience to users.

"Inductive charging system": A system transferring energy from a power source to an EV through a two-part gapped core transformer in which the two halves of the transformer, primary and secondary coils, are physically separated from one another. In the present disclosure, the inductive charging system may correspond to an EV power transfer system.

"Inductive coupler": The transformer formed by the coil in the GA Coil and the coil in the VA Coil that allows power to be transferred with galvanic isolation.

"Inductive coupling": Magnetic coupling between two coils. In the present disclosure, coupling between the GA Coil and the VA Coil.

"Ground assembly (GA)": An assembly on the infrastructure side of the GA Coil, a power/frequency conversion unit and GA controller as well as the wiring from the grid and between each unit, filtering circuits, housing(s) etc., necessary to function as the power source of wireless power charging system. The GA may include the communication elements necessary for communication between the GA and the VA.

"Vehicle assembly (VA)": An assembly on the vehicle of the VA Coil, rectifier/power conversion unit and VA controller as well as the wiring to the vehicle batteries and between each unit, filtering circuits, housing(s), etc., necessary to function as the vehicle part of a wireless power charging system. The VA may include the communication elements necessary for communication between the VA and the GA. The GA may be referred to as a supply device, and the VA may be referred to as an EV device.

"Supply device": An apparatus which provides the contactless coupling to the EV device. In other words, the supply device may be an apparatus external to an EV. When the EV is receiving power, the supply device may operate as the source of the power to be transferred. The supply device may include the housing and all covers.

"EV device": An apparatus mounted on the EV which provides the contactless coupling to the supply device. In other words, the EV device may be installed in the EV. When the EV is receiving power, the EV device may transfer the power from the primary to the EV. The EV device may include the housing and all covers.

"GA controller": The portion of the GA which regulates the output power level to the GA Coil based on information from the vehicle.

"VA controller": The portion of the VA that monitors specific on-vehicle parameters during charging and initiates communication with the GA to control output power level. The GA controller may be referred to as a supply power circuit (SPC), and the VA controller may be referred to as an electric vehicle (EV) power circuit (EVPC).

"Magnetic gap": The vertical distance between the plane of the higher of the top of the litz wire or the top of the magnetic material in the GA Coil to the plane of the lower of the bottom of the litz wire or the magnetic material in the VA Coil when aligned.

"Ambient temperature": The ground-level temperature of the air measured at the subsystem under consideration and not in direct sun light.

"Vehicle ground clearance": The vertical distance between the ground surface and the lowest part of the vehicle floor pan.

"Vehicle magnetic ground clearance": The vertical distance between the plane of the lower of the bottom of the litz wire or the magnetic material in the VA Coil mounted on a vehicle to the ground surface.

"VA coil magnetic surface distance": the distance between the plane of the nearest magnetic or conducting component surface to the lower exterior surface of the VA coil when mounted. This distance includes any protective coverings and additional items that may be packaged in the VA coil enclosure. The VA coil may be referred to as a secondary coil, a vehicle coil, or a receive coil. Similarly, the GA coil may be referred to as a primary coil, or a transmit coil.

"Exposed conductive component": A conductive component of electrical equipment (e.g., an electric vehicle) that may be touched and which is not normally energized but which may become energized in case of a fault.

"Hazardous live component": A live component, which under certain conditions may generate a harmful electric shock.

"Live component": Any conductor or conductive component intended to be electrically energized in normal use.

"Direct contact": Contact of persons with live components. (See IEC 61440)

"Indirect contact": Contact of persons with exposed, conductive, and energized components made live by an insulation failure. (See IEC 61140)

"Alignment": A process of finding the relative position of supply device to EV device and/or finding the relative position of EV device to supply device for the efficient power transfer that is specified. In the present disclosure, the alignment may direct to a fine positioning of the wireless power transfer system.

"Pairing": A process by which a vehicle is correlated with the unique dedicated supply device, at which it is located and from which the power will be transferred. Pairing may include the process by which a VA controller and a GA controller of a charging spot are correlated. The correlation/association process may include the process of association of a relationship between two peer communication entities.

"High-level communication (HLC)": HLC is a special type of digital communication. HLC is necessary for additional services which are not covered by command & control communication. The data link of the HLC may use a power line communication (PLC), but it is not limited.

"Low-power excitation (LPE)": LPE means a technique of activating the supply device for the fine positioning and pairing so that the EV may detect the supply device, and vice versa.

"Service set identifier (SSID)": SSID is a unique identifier consisting of 32-characters attached to a header of a packet transmitted on a wireless LAN. The SSID identifies the basic service set (BSS) to which the wireless device attempts to connect. The SSID distinguishes multiple wireless LANs. Therefore, all access points (APs) and all terminal/station devices that want to use a specific wireless LAN may use the same SSID. Devices that do not use a unique SSID are not able to join the BSS. Since the SSID is shown as plain text, it may not provide any security features to the network.

"Extended service set identifier (ESSID)": ESSID is the name of the network to which one desires to connect. It is similar to SSID but a more extended concept.

"Basic service set identifier (BSSID)": BSSID consisting of 48 bits is used to distinguish a specific BSS. In the case of an infrastructure BSS network, the BSSID may be medium access control (MAC) of the AP equipment. For an independent BSS or ad hoc network, the BSSID may be generated with any value.

The charging station may include at least one GA and at least one GA controller configured to manage the at least one GA. The GA may include at least one wireless communication device. The charging station may refer to a place or location having at least one GA, which is installed in a home, office, public place, road, parking area, etc. According to exemplary embodiments of the present disclosure, "rapid charging" may refer to a method of directly converting AC power of a power system to direct current (DC) power, and supplying the converted DC power to a battery mounted on an EV. In particular, a voltage of the DC power may be DC 500 volts (V) or less.

According to exemplary embodiments of the present disclosure, "slow charging" may refer to a method of charging a battery mounted on an EV using AC power supplied to a general home or workplace. An outlet in each home or workplace, or an outlet disposed in a charging stand may provide the AC power, and a voltage of the AC power may be AC 220V or less. The EV may further include an on-board charger (OBC) configured to boost the AC power for the slow charging, convert the AC power to DC power, and supply the converted DC power to the battery.

According to exemplary embodiments of the present disclosure, a frequency tuning may be used for performance optimization. In particular, the frequency tuning may be performed by a supply device and may not be performed by an EV device. Additionally, it may be required for all the supply devices to provide the frequency tuning over a full range. An electric vehicle power controller (EVPC) may operate in a frequency range between about 81.38 kHz and 90.00 kHz. A nominal frequency (hereinafter, referred to as a target frequency, a design frequency, or a resonance frequency) for the magnetic field wireless power transfer (MF-WPT) may be about 85 kHz. The power supply circuits may provide the frequency tuning.

Hereinafter, exemplary embodiments of the present disclosure will be explained in detail by referring to accompanying figures.

FIG. 1 is a conceptual diagram illustrating a concept of a wireless power transfer (WPT) to which exemplary embodiments of the present disclosure are applied.

As shown in FIG. 1, a WPT may be performed by at least one component of an electric vehicle (EV) 10 and a charging station 20, and may be used for wirelessly transferring power to the EV 10. Here, the EV 10 may be usually defined as a vehicle supplying an electric power stored in a rechargeable energy storage including a battery 12 as an energy source of an electric motor which is a power train system of the EV 10.

However, the EV 10 according to exemplary embodiments of the present disclosure may include a hybrid electric vehicle (HEV) having an electric motor and an internal combustion engine together, and may include not only an automobile but also a motorcycle, a cart, a scooter, and an electric bicycle. Additionally, the EV 10 may include a power reception pad 11 including a reception coil for charging the battery 12 wirelessly and may include a plug connection for conductively charging the battery 12. In particular, the EV 10 configured for conductively charging the battery 12 may be referred to as a plug-in electric vehicle (PEV).

Here, the charging station 20 may be connected to a power grid 30 or a power backbone, and may provide an alternating current (AC) power or a direct current (DC) power to a power transmission pad 21 including a transmission coil through a power link. Additionally, the charging station 20 may be configured to communicate with an infrastructure management system or an infrastructure server that manages the power grid 30 or a power network via wired/wireless communications, and perform wireless communications with the EV 10. The wireless communications may be Bluetooth, ZigBee, cellular, wireless local area network (WLAN), or the like. For example, the charging station 20 may be located at various places including a parking area attached to the a house, a parking area for charging an EV at a gas station, a parking area at a shopping center or a workplace.

A process of wirelessly charging the battery 12 of the EV 10 may begin with first disposing the power reception pad 11 of the EV 10 in an energy field generated by the power transmission pad 21, and coupling the reception coil and the transmission coil with each other. An electromotive force may be induced in the power reception pad 11 as a result of the interaction or coupling, and the battery 12 may be charged by the induced electromotive force.

The charging station 20 and the transmission pad 21 may be referred to as a ground assembly (GA) in whole or in part, where the GA may refer to the previously defined meaning. All or part of the internal components and the reception pad 11 of the EV 10 may be referred to as a vehicle assembly (VA), in which the VA may refer to the previously defined meaning. The power transmission pad or the power reception pad may be configured to be non-polarized or polarized.

When a pad is non-polarized, one pole is disposed in a center of the pad and an opposite pole is disposed in an external periphery. In particular, a flux may be formed to exit from the center of the pad and return at all to external boundaries of the pad. When a pad is polarized, a respective pole may be disposed at either end portion of the pad. In particular, a magnetic flux may be formed based on an orientation of the pad. In the present disclosure, the transmission pad 21 or the reception pad 11 may collectively be referred to as a "wireless charging pad".

Figure 2:
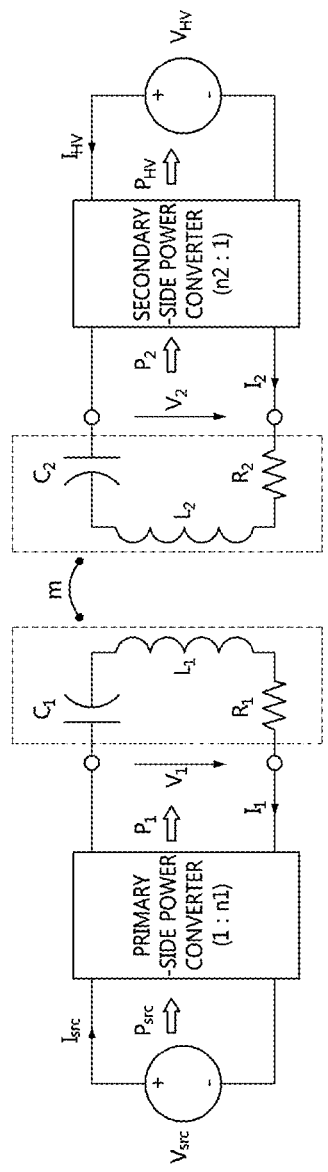
FIG. 2 is a conceptual diagram illustrating a WPT circuit according to exemplary embodiments of the present disclosure.

FIG. 2 is a conceptual diagram illustrating a WPT circuit according to exemplary embodiments of the present disclosure.

As shown in FIG. 2, a schematic configuration of a circuit in which a WPT is performed in an EV WPT system is shown. The left side of FIG. 2 may be interpreted as expressing all or part of a power source $V_{src}$ supplied from the power network, the charging station 20, and the transmission pad 21 in FIG. 1, and the right side of FIG. 2 may be interpreted as expressing all or part of the EV including the reception pad and the battery.

First, the left-side circuit of FIG. 2 may provide an output power $P_{src}$ that corresponds to the power source $V_{src}$ supplied from the power network to a primary-side power converter. The primary-side power converter may be configured to supply an output power $P_1$ converted from the output power $P_{src}$ through frequency-converting and AC-to-DC/DC-to-AC converting to generate an electromagnetic field at a desired operating frequency in a transmission coil $L_1$.

In particular, the primary-side power converter may include an AC/DC converter configured to convert the power $P_{src}$ which is an AC power supplied from the power network into a DC power, and a low-frequency (LF) converter configured to convert the DC power into an AC power having an operating frequency suitable for wireless charging. For example, the operating frequency for wireless charging may be determined to be within about 79 to 90 kHz.

The power $P_1$ output from the primary-side power converter may be supplied again to a circuit including the transmission coil $L_1$, a first capacitor $C_1$ and a first resistor $R_1$. In particular, a capacitance of the first capacitor $C_1$ may be determined as a value to have an operating frequency suitable for charging together with the transmission coil $L_1$. The first resistor $R_1$ may represent a power loss occurred by the transmission coil $L_1$ and the first capacitor $C_1$.

Further, the transmission coil $L_1$ may be made to have electromagnetic coupling, which is defined by a coupling coefficient m, with the reception coil $L_2$ so that a power $P_2$ is transmitted, or the power $P_2$ is induced in the reception coil $L_2$. Therefore, the meaning of power transfer in the present disclosure may be used together with the meaning of power induction. Still further, the power $P_2$ induced in or transferred to the reception coil $L_2$ may be provided to a secondary-side power converter. Particularly, a capacitance of a second capacitor $C_2$ may be determined as a value having an operating frequency suitable for wireless charging together with the reception coil $L_2$, and a second resistor $R_2$ may represent a power loss occurring by the reception coil $L_2$ and the second capacitor $C_2$.

The secondary-side power converter may include an AC-to-DC converter configured to convert the supplied power $P_2$ of a specific operating frequency to a DC power having a voltage level suitable for the battery $V_{HV}$ of the EV. The electric power $P_{HV}$ converted from the power $P_2$ supplied to the secondary-side power converter may be output, and the power $P_{HV}$ may be used for charging the battery $V_{HV}$ disposed in the EV.

The right side circuit of FIG. 2 may further include a switch for selectively connecting or disconnecting the reception coil $L_2$ with the battery $V_{HV}$. In particular, resonance frequencies of the transmission coil $L_1$ and the reception coil $L_2$ may be similar or identical to each other, and the reception coil $L_2$ may be positioned near the electromagnetic field generated by the transmission coil $L_1$. The circuit of FIG. 2 should be understood as an illustrative circuit for WPT in the EV WPT system used for exemplary embodiments of the present disclosure, and is not limited to the circuit illustrated in FIG. 2.

On the other hand, since the power loss may increase as the transmission coil $L_1$ and the reception coil $L_2$ are separated by a predetermined distance, the relative positions of the transmission coil $L_1$ and the reception coil $L_2$ may be set. The transmission coil $L_1$ may be included in the transmission pad 21 in FIG. 1, and the reception coil $L_2$ may be included in the reception pad 11 in FIG. 1. Additionally, the transmission coil may be referred to as a GA coil, and the reception coil may be referred to as a VA coil. Therefore, position alignment between the transmission pad and the reception pad or position alignment between the EV and the transmission pad will be described below with reference to the drawings.

Figure 3:
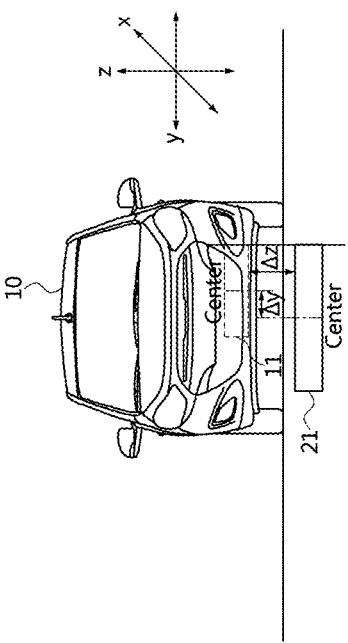
FIG. 3 is a conceptual diagram for explaining a concept of alignment in an EV WPT according to exemplary embodiments of the present disclosure.

FIG. 3 is a conceptual diagram for explaining a concept of alignment in an EV WPT according to exemplary embodiments of the present disclosure.

As shown in FIG. 3, a method of aligning the power transmission pad 21 and the power reception pad 11 in the EV in FIG. 1 will be described. In particular, positional alignment may correspond to the alignment, which is the above-mentioned term, and thus may be defined as positional alignment between the GA and the VA, but is not limited to the alignment of the transmission pad and the reception pad. Although the transmission pad 21 is illustrated as positioned below a ground surface as shown in FIG. 3, the transmission pad 21 may also be positioned on the ground surface, or positioned to expose a top portion surface of the transmission pad 21 below the ground surface.

The reception pad 11 of the EV may be defined by different categories based on heights (defined in the z-direction) measured from the ground surface. For example, a class 1 for reception pads having a height of about 100-150 millimeters (mm) from the ground surface, a class 2 for reception pads having a height of about 140-210 mm, and a class 3 for reception pads having a height of about 170-250 mm may be defined. The reception pad may support a part of the above-described classes 1 to 3. For example, only the class 1 may be supported according to the type of the reception pad 11, or the class 1 and 2 may be supported according to the type of the reception pad 11. The height of the reception pad measured from the ground surface may correspond to the previously defined term "vehicle magnetic ground clearance."

Further, the position of the power transmission pad 21 in the height direction (i.e., defined in the z-direction) may be determined to be disposed between the maximum class and the minimum class supported by the power reception pad 11. For example, when the reception pad supports only the class 1 and 2, the position of the power transmission pad 21 may be determined between about 100 and 210 mm with respect to the power reception pad 11.

In addition, a gap between the center of the power transmission pad 21 and the center of the power reception pad 11 may be determined to be disposed within the limits of the horizontal and vertical directions (defined in the x- and y-directions). For example, the gap may be determined to be located within ±75 mm in the horizontal direction (defined in the (+y)-direction or in the right direction perpendicular to the vehicle direction), and within ±100 mm in the vertical direction (defined in the (−x)-direction or in a vehicle travelling direction). The relative positions of the power transmission pad 21 and the power reception pad 11 may be varied in accordance with experimental results, and the numerical values should be understood as exemplary.

Although the alignment between the pads is described on the assumption that each of the transmission pad 21 and the reception pad 11 includes a coil, more particularly, the alignment between the pads may refer to the alignment between the transmission coil (or GA coil) and the reception coil (or VA coil) which are respectively included in the transmission pad 21 and the reception pad 11.

Meanwhile, to maximize charging efficiency during wireless charging to an EV (EV wireless charging), low-frequency (LF) signals may be used for alignment between the primary coil (i.e., GA coil) and the secondary coil (i.e., VA coil). The LF signal is a digitally modulated magnetic field that operates in a low frequency ITU radio band. An LF sensor may operate at a fixed frequency within a frequency range of 19 kHz to 300 kHz.

Figure 4:
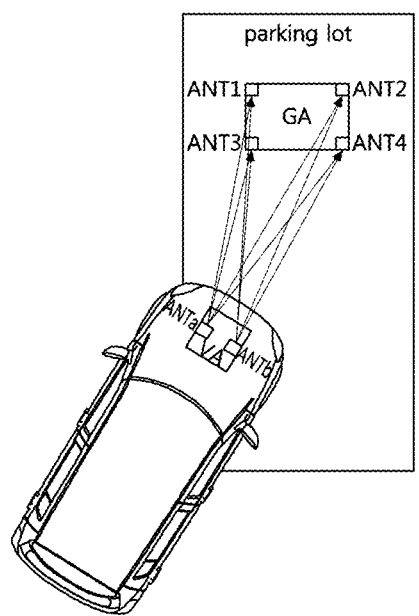
FIG. 4 is a conceptual diagram illustrating position alignment for wireless charging to which exemplary embodiments of the present disclosure are applied.

In addition, the magnetic field may be generated by at least two antennas located in the EV. The LF antennas in the EV may be located, for example, in the positions as shown in FIG. 4 below, without being limited by the exemplary embodiment. Preferably, the distance between the antennas located in the EV may be maintained at 600 mm.

Additionally, the primary side device may comprise at least two magnetic sensors, wherein sensing elements of the magnetic sensor may be preferably arranged symmetrically. The magnetic sensors can measure a strength of the magnetic field in the x, y, and z directions.

Meanwhile, in the society of automotive engineers (SAE) standard meetings, considering autonomous driving technology, position alignment techniques using autonomous (or, automatic) parking or remote parking is being studied.

Also, according to ISO 15118-8 that is an EV charging communication standard document, when wireless communication for charging an EV is used, communication between an electric vehicle communication controller (EVCC) and a supply equipment communication controller (SECC) conforms to the IEEE 802.11-2012. A required range of a distance between the EVCC and the SECC for a communication channel considered in the wireless communication is 5 m to 30 m for discovery, 10 cm to 5 m for fine positioning (fine alignment), and 5 cm to 5 m for charge control.

Here, the discovery is a step in which an EV searches for a charging pad, and the EVCC enters a communication region of at least one SECC and connects with an appropriate SECC. The fine positioning may refer to alignment between primary and EV devices (i.e., coils) for efficient power transfer in case of WPT, and alignment between connectors of the EV and an EVSE for power transfer in case of an automatic connection for conductive charging. The charge control may be in form of, for example, a power request from the EV to the EVSE.

FIG. 4 is a conceptual diagram illustrating position alignment for wireless charging to which exemplary embodiments of the present disclosure are applied.

As shown in FIG. 4, a position alignment method according to an exemplary embodiment of the present disclosure, which is a method for maximizing and/or optimizing the wireless charging efficiency by aligning a primary coil of a GA to a secondary coil of a VA, may be performed based on measurement of magnetic fields between four antennas ANT1, ANT2, ANT3 and ANT4 in the GA side and two antennas ANTa and ANTb in the VA side.

In particular, the VA may include two antennas, and the two antennas may be disposed one by one (e.g., sequentially) in the left and right regions of the VA. The left and right regions may refer to regions divided into two halves of the VA, and may be left and right symmetrically separated regions. When the VA has a rectangular structure, the two antennas may be disposed at the center of the left side and the center of the right side respectively of the rectangular structure, but the structure is not limited to a rectangle because it may be changed according to a design selection.

Additionally, the two antennas may be disposed in a specific portion of the vehicle as connected with the VA, in which case they may be disposed one by one in the left and right regions of the specific portion of the vehicle. The left region and the right region of the specific portion of the vehicle may refer to symmetrically separated regions in the specific portion of the vehicle. Alternatively, instead of the left and right regions of the specific portion of the VA or the vehicle, a front region and a rear region of the specific portion of the VA or the vehicle may be used, but are not limited thereto. In other words, two regions that are symmetrically separated may be generally used. Hereinafter, it will be assumed that the antennas are disposed in the VA.

The VA or a VA controller may control the antennas and calculate position difference information between the VA and the GA.

The GA may include four antennas, and the four antennas may be disposed in a first region, a second region, a third region, and a fourth region of the GA, respectively, and the first, second, third, and fourth regions may refer to a upper left region, a upper right region, a lower left region, and a lower right region of the GA, respectively. However, exemplary embodiments of the present disclosure are not limited thereto, and may refer to regions divided from the GA into quadrants to have the same size. When the GA has a rectangular structure, the four antennas may be disposed at each corner of the rectangular structure, but the structure is not limited to a rectangle because it may be changed according to a design selection. Additionally, the GA or a GA controller may also calculate magnetic field measurement values based on magnetic fields detected by the four antennas.

Herein, the antenna included in the VA and/or GA may refer to a loop antenna or may refer to a ferrite rod antenna, but is not limited thereto. The ferrite rod antenna can be used in vehicles, portable radios, and aircraft due to its reduced size, have almost no reflection, and allow for good range control with a gentle reduction in the field strength. Also, the ferrite rod antenna may have a high penetration rate, require a low quiescent current according to a resonant frequency input stage, and may be less susceptible to detuning compared to high frequencies. However, since the ferrite rod antenna has a very high Q factor, it is possible to filter some of required signal modulation.

The ferrite rod antenna may refer to an antenna using an LF. A ferrite rod loop antenna may be thought of as a special case of conventional air-core loop antennas. The air-core loop antenna is synonymous with a solenoid. Thus, a magnetic field in the solenoid may be expressed on the basis of Ampere's law. However, since a medium inside a coil in the solenoid is air, if the inside medium is a ferrite rod, the ferrite rod, the medium inside the coil, should be reflected. In addition, considering the number of turns of the coil, the radius of the coil, the length of the coil, etc., the final magnetic field of the LF antenna (i.e., ferrite rod loop antenna) may be expressed by Equation 1 below.

$$B = \frac{\mu_o I N a^2}{2(a^2 + r^2)^{3/2}} \approx \frac{\mu_o I N a^2}{2r^3} \text{[Tesla]} \quad \text{[Equation 1]}$$

where
$\mu_O$=magnetic permeability
I=Current [A]
N=Number of turns
a=radius of coil [m]
r=distance from coil [m]

Meanwhile, the LF may refer to an LF band using a band of 30 to 300 kHz among 12 frequency ranges classified by International Telecommunication Union (ITU). Table 1 below shows the frequency ranges divided into 12 ranges in the ITU.

TABLE 1

| | Abbreviation | Frequency range | Wave length range |
|---|---|---|---|
| 1 | ELF | 3~30 Hz | 100,000~10,000 km |
| 2 | SLF | 30~300 Hz | 10,000~1000 km |
| 3 | ULF | 300~3000 Hz | 1000~100 km |
| 4 | VLF | 3~30 kHz | 100~10 km |
| 5 | LF | 30~300 kHz | 10~1 km |
| 6 | MF | 300~3000 kHz | 1000~100 m |
| 7 | HF | 3~30 MHz | 100~10 m |
| 8 | VHF | 30~300 MHz | 10~1 m |
| 9 | UHF | 300~3000 MHz | 1~0.1 m |
| 10 | SHF | 3~30 GHz | 100~10 mm |
| 11 | EHF | 30~300 GHz | 10~1 mm |
| 12 | THF | 300~3000 GHz | 1~0.1 mm |

Figure 5A:
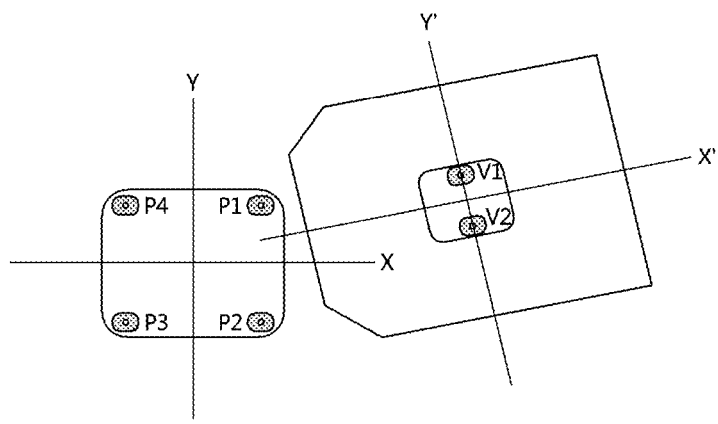
FIGS. 5A and 5B are diagrams illustrating an example of LF antenna alignment between a transmission pad and a reception pad.
Figure 5B:
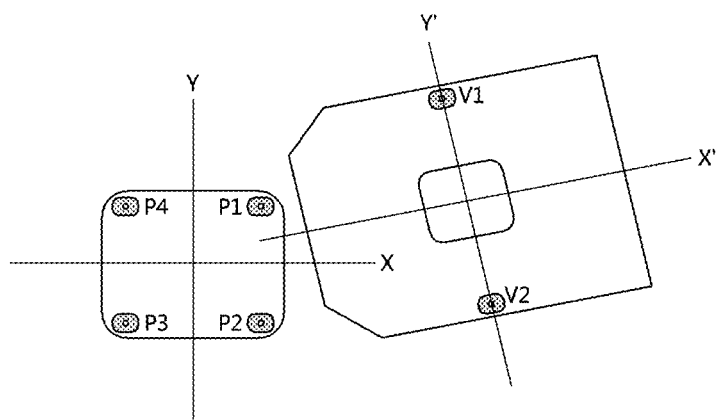

FIGS. 5A and 5B are diagrams illustrating an example of LF antenna alignment between a transmission pad and a reception pad.

As shown in FIGS. 5A and 5B, a (x, y) coordinate system represents a coordinate system for a transmission pad of an EVSE, and a (x', y') coordinate system represents a coordinate system of a vehicle (or, reception pad). The antennas of the EVSE side (or, transmission pad) are represented by P1, P2, P3 and P4, and are arranged symmetrically in the upper left, upper right, lower left and lower right region of the transmission pad. The antennas of the vehicle side are represented by V1 and V2, and are symmetrically located around the magnetic field structure of the reception pad as shown in FIG. 5A. Meanwhile, in FIG. 5B, the vehicle side antennas V1 and V2 are symmetrically positioned around the magnetic field structure away from the reception pad.

In consideration of such the arrangement, the vehicle side device and the power supply side device may perform position alignment using the LF signals.

That is, when the vehicle approaches a specific parking spot for charging, a frequency for the corresponding parking spot selected by an SECC may be reported to the vehicle through a WLAN link. The vehicle may transmit a corresponding trigger signal to the power supply side device at the selected frequency. The SECC may return a received signal strength intensity (RSSI) value measured by a sensor to the vehicle. As such, a position measurement algorithm may be performed by the vehicle based on the RSSI value fed back by the power supply side device.

The vehicle (i.e., EV) may request fine positioning using an LF. The SECC, which receives the request for fine positioning, may request the power supply side device to turn on a receiver, and inform the vehicle of a frequency to use. The vehicle may turn on a receiver and may start at the specified frequency.

When a driver moves the vehicle to the parking spot, that is, a charging spot, and the reception coil of the vehicle approaches within 4 m~6 m of the transmission coil of the power supply side, the receiver of the transmission coil may detect a signal transmitted by the vehicle.

The vehicle may transmit LF signals for positioning to the transmission coil, and the SECC may transmit measured raw data to the vehicle through a WLAN link. Based on the measured values, the vehicle may dynamically calculate the position of the transmission coil.

As such, according to an exemplary embodiment of the present disclosure, the vehicle may measure the distance between the transmission pad and the reception pad based on the RSSI received from the power supply device.

Distance measurement based on RSSI may be expressed according to Equation 2 below.

$$d = 10^{\frac{-RSSI + A_r}{10^n}} \text{ or } d = \frac{\lambda}{4\pi} \cdot 10^{\frac{L}{20}} = \frac{c}{4\pi f} \cdot 10^{\frac{L}{20}} \quad \text{[Equation 2]}$$

Here, d denotes a distance, n denotes a signal propagation constant, and $A_r$ denotes a RSSI value per meter. Further, $\lambda$ denotes a wavelength of propagation, c denotes a speed of propagation, f denotes a frequency of radio wave, and L denotes propagation path loss (transmitting signal strength–received signal strength)

The position alignment for wireless charging may be accomplished using LF signals and magnetic vectoring. The magnetic vectoring is a scheme of measuring a distance by detecting weak magnetic fields. For the magnetic vectoring, auxiliary coils are wound around three axes (X, Y, Z) on a transmission coil, and auxiliary coils are wound around two axes (X, Y) on a reception coil. That is, the distance is measured by sensing the weak magnetic fields induced in the auxiliary coils.

Meanwhile, recent experiments have reported that precise alignment is difficult when LF signals and magnetic vectoring are used in the EV wireless charging.

Figure 6:
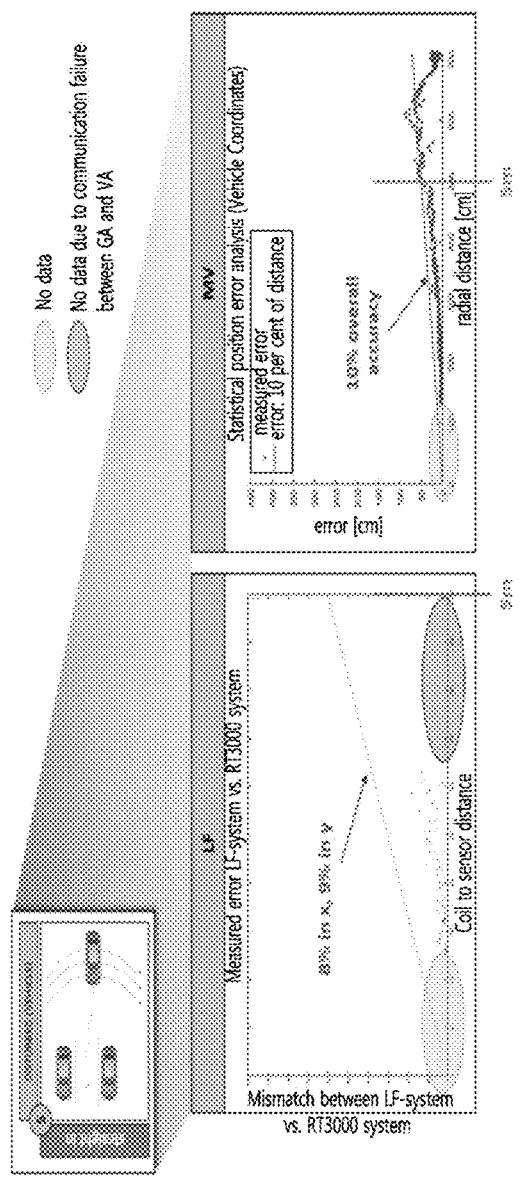
FIG. 6 is a diagram illustrating an error occurring when aligning positions using LF signals or magnetic vectoring.

FIG. 6 is a diagram illustrating an error occurring when aligning positions using LF signals or magnetic vectoring.

A result shown in FIG. 6 is a result of aligning positions by using four LF antennas or LF sensors in a transmission coil and two LF antennas or LF sensors in a reception coil as defined in the IEC 61980-2 TS standard document. The result shown in FIG. 6 indicates that position-related data cannot be obtained when a distance between the transmission coil and the reception coil is very near. That is, it can be confirmed that precise alignment is difficult when aligning the positions using the LF signals and the magnetic vectoring.

This is most likely due to the use of a weak magnetic field with magnetic field strength of tens of nT, which is used when measuring the distance by using the LF signals or the magnetic field strengths of the auxiliary coils for the magnetic vectoring. That is, in case of using the weak magnetic fields, if the distance between the transmission coil and the reception coil is very near (e.g., 0 to 0.5 m), the weak magnetic field differences between the auxiliary coils (or auxiliary antennas) of the transmission coil and the auxiliary coils (or auxiliary antennas) of the reception coil becomes difficult to be distinguished, so that it is difficult to accurately determine the distance between the transmission coil and the reception coil.

In addition, according to the IEC 61980-2 TS standard document, four LF antennas or LF sensors are disposed on a transmission coil, and two LF antennas or LF sensors are disposed on a reception coil to determine position information by using a weak magnetic field. However, as described above, there may be difficulty in determining the position information at a very short distance by using such the structure.

Therefore, the present disclosure proposes a method for enabling precise alignment at a very near distance (e.g., 0 to 0.5 m) when aligning the positions using the LF signals for EV wireless charging.

The international standard for EV wireless charging does not clearly describe a signal transmission process of antennas and sensors for LF signals.

According to an exemplary embodiment of the present disclosure, when a magnetic field is transmitted from the LF antennas of the reception coil, a magnetic flux density may be changed until the alignment is completed without using only the maximum magnetic flux density. Through this, the LF antenna (or LF sensor) of the transmission coil can recognize the magnetic flux density of the LF antenna of the reception coil even at a very short distance (e.g., 0 to 0.5 m).

According to an exemplary embodiment of the present disclosure, a magnetic flux density for a first LF signal emitted from the LF antenna may be set to the maximum value, and a magnetic flux density for a second LF signal emitted from the LF antenna may be set to the minimum value. The two signals are configured in one package, and the configured signals may transmitted to the LF antenna (or LF sensor) of the transmission coil.

When the reception coil approaches the transmission coil and the distance between the two coils is within a very near distance (e.g., 0 to 0.5 m), for the magnetic flux density of the LF receiving antenna located in the transmission coil, a value measured at a first time point may be compared with a value measured at a second time point in order to efficiently perform a position measurement algorithm. According to an exemplary embodiment of the present disclosure, when a difference between the two values does not exceed a predetermined threshold, the corresponding data (e.g., the magnetic flux density measured at the first time point or the magnetic flux density measured at the second time point) may be excluded from the position measurement algorithm.

Then, a calculation on the distance between the transmission pad and the reception pad may be performed using only significant data on the magnetic flux densities of the LF antennas. In this case, a method using RSSI may be used for distance measurement.

Here, a time interval between a transmission time point of the first signal whose magnetic flux density is set to the maximum value and a transmission time point of the second signal whose magnetic flux density is set to the minimum value may be very short. Further, a time interval between the first package and the second package subsequent to the first package may be set longer than the time interval between the first signal and the second signal in the same package.

When the reception coil approaches the center of the transmission coil to maximize charging efficiency and is located within a very near distance (e.g., 0 to 0.5 m), the magnetic flux density measured by the LF antenna or the LF sensor of the transmission coil may be almost unchanged. Thus, in an exemplary embodiment of the present disclosure, for effective calculation for a distance measurement algorithm, magnetic flux densities at different time points for each LF antenna of the transmission coil may be compared, and when a difference thereof does not exceed a predetermined threshold, the corresponding data may be excluded from data for the position measurement algorithm.

Meanwhile, a method of measuring a distance by analyzing the magnetic fields due to the LF signals, which is described in the EV wireless charging related standard document, uses a formula as shown in equations below.

For example, the magnetic flux densities detected by the LF antennas of the transmission coil that receive the magnetic field transmitted by the LF antenna α of the reception coil at time t0 may be expressed as shown in Equation 3 below.

$$\overline{B}(LF\ antenna\ A, t0) = \overline{B}LFAAy, t0 \cdot \overline{B}LFA\alpha y, t0$$

$$\overline{B}(LF\ antenna\ B, t0) = \overline{B}LFABy, t0 \cdot \overline{B}LFA\alpha y, t0$$

$$\overline{B}(LF\ antenna\ C, t0) = \overline{B}LFACy, t0 \cdot \overline{B}LFA\alpha y, t0$$

$$\overline{B}(LF\ antenna\ D, t0) = \overline{B}LFADy, t0 \cdot \overline{B}LFA\alpha y, t0 \qquad [\text{Equation 3}]$$

In addition, the magnetic flux densities detected by the LF antennas (i.e., LF antenna A, LF antenna B, LF antenna C, LF antenna D) of the transmission coil that receive the magnetic field transmitted by the LF antenna β of the reception coil at time t1 may be expressed as shown in Equation 4 below.

$$\overline{B}(LF\ antenna\ A, t1) = \overline{B}LFAAy, t1 \cdot \overline{B}LFA\beta y, t1$$

$$\overline{B}(LF\ antenna\ B, t1) = \overline{B}LFABy, t1 \cdot \overline{B}LFA\beta y, t1$$

$$\overline{B}(LF\ antenna\ C, t1) = \overline{B}LFACy, t1 \cdot \overline{B}LFA\beta y, t1$$

$$\overline{B}(LF\ antenna\ D, t1) = \overline{B}LFADy, t1 \cdot \overline{B}LFA\beta y, t1 \qquad [\text{Equation 4}]$$

Therefore, equations for final RSSIs calculated by the LF antennas of the reception coil at the times t0 and t1 may be summarized as shown in Equation 5 below.

$$RSSI(\overline{B}(LF\ antenna\ A, t0), \overline{B}(LF\ antenna\ B, t0), \overline{B}(LF\ antenna\ C, t0), \overline{B}(LF\ antenna\ D, t0))$$

$$RSSI(\overline{B}(LF\ antenna\ A, t1), \overline{B}(LF\ antenna\ B, t1), \overline{B}(LF\ antenna\ C, t1), \overline{B}(LF\ antenna\ D, t1)) \qquad [\text{Equation 5}]$$

Eventually, the LF antenna or LF sensor of the transmission coil receives all the magnetic flux densities transmitted by the LF antenna of the reception coil. However, since the LF antenna of the reception coil emits the maximum magnetic flux density, the LF transmitters of the reception coils cannot be distinguished at a very near distance (e.g., 0 to 0.5 m).

According to an exemplary embodiment of the present disclosure, when a magnetic field is transmitted from the LF antennas of the reception coil, a magnetic flux density may be changed until the alignment is completed without using only the maximum magnetic flux density, so that the LF antenna (or LF sensor) of the transmission coil can recognize the magnetic flux density of the LF antenna of the reception coil even at a very short distance (e.g., 0 to 0.5 m).

That is, a magnetic flux density for a first LF signal emitted from the LF antenna of the reception coil may be set to the maximum value, and a magnetic flux density for a second LF signal emitted from the LF antenna of the reception coil may be set to the minimum value. The two signals are configured in one package, and the configured signals may transmitted to the LF antenna (or LF sensor) of the transmission coil. Here, a time interval between a transmission time point of the first signal whose magnetic flux density is set to the maximum value and a transmission time point of the second signal whose magnetic flux density is set to the minimum value may be very short. Also, a time interval between the first package and the second package subsequent to the first package may be set longer than the time interval between the first signal and the second signal in the same package.

In summary, when the reception coil approaches the center of the transmission coil to maximize charging efficiency and comes within a very near distance (e.g., 0 to 0.5 m), the magnetic flux density measured by the LF antenna or the LF sensor of the transmission coil may be almost unchanged. Thus, in an exemplary embodiment of the present disclosure, for effective calculation for a distance measurement algorithm, magnetic flux densities at different time points for each LF antenna of the transmission coil may be compared, and when a difference thereof does not exceed a predetermined threshold, the corresponding data may be excluded from data for the position measurement algorithm.

Figure 7A:
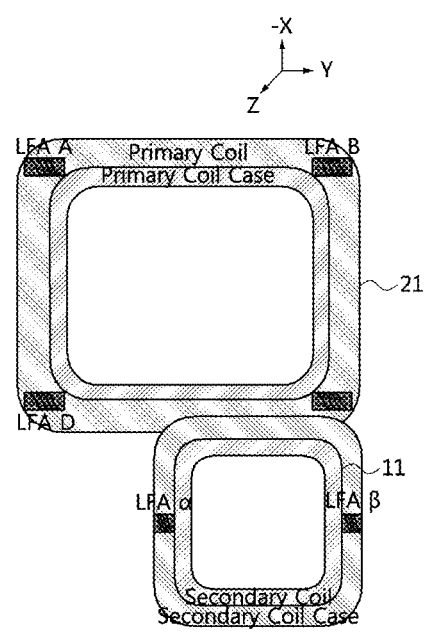
FIG. 7A is a diagram describing magnetic flux densities when a transmission coil and a reception coil are located within a very short distance according to an exemplary embodiment of the present disclosure.

FIG. 7A is a diagram describing magnetic flux densities when a transmission coil and a reception coil are located within a very short distance according to an exemplary embodiment of the present disclosure.

In this exemplary embodiment, a case where the LF transmitters of the reception coil emit the maximum value of the LF magnetic field at an arbitrary time point will be described. In this case, the maximum value may mean a maximum value within a preconfigured range of a magnetic field that the LF antenna of the reception pad can use for emission to the LF antenna or sensor of the transmission pad during position alignment.

For example, the magnetic flux densities detected by the LF antennas (i.e., LF antenna A, LF antenna B, LF antenna C, LF antenna D) of the transmission coil that receive the maximum value of the magnetic field emitted by the LF antenna α of the reception coil at time t0 may be expressed as shown in Equation 6 below.

$$\overline{B}(LF\ antenna\ A, t0) = \overline{B}LFAA, t0 \cdot \overline{B}LFA\alpha(max), t0$$

$$\overline{B}(LF\ antenna\ B, t0) = \overline{B}LFAB, t0 \cdot \overline{B}LFA\alpha(max), t0$$

$$\overline{B}(LF\ antenna\ C, t0) = \overline{B}LFAC, t0 \cdot \overline{B}LFA\alpha(max), t0$$

$$\overline{B}(LF\ antenna\ D, t0) = \overline{B}LFAD, t0 \cdot \overline{B}LFA\alpha(max), t0 \qquad [\text{Equation 6}]$$

In addition, the magnetic flux densities detected by the LF antennas of the transmission coil that receive the maximum value of the magnetic field emitted by the LF antenna β of the reception coil at time t1 may be expressed as shown in Equation 7 below.

$$\overline{B}(\text{LF antenna } A, t1) = \overline{B}\text{LF}AA, t1 \cdot \overline{B}\text{LF}A\beta(\max), t1$$

$$\overline{B}(\text{LF antenna } B, t1) = \overline{B}\text{LF}AB, t1 \cdot \overline{B}\text{LF}A\beta(\max), t1$$

$$\overline{B}(\text{LF antenna } C, t1) = \overline{B}\text{LF}AC, t1 \cdot \overline{B}\text{LF}A\beta(\max), t1$$

$$\overline{B}(\text{LF antenna } D, t1) = \overline{B}\text{LF}AD, t1 \cdot \overline{B}\text{LF}A\beta(\max), t10 \quad [\text{Equation 7}]$$

Here, t0 is a time point at which each LF antenna of the transmission coil receives the magnetic field emitted by the LF antenna α of the reception coil, and t1 is a time point at which each LF antenna of the transmission coil receives the magnetic field emitted by the LF antenna β of the reception coil. Therefore, t0 and t1 may be different values, or may be the same value.

Figure 7B:
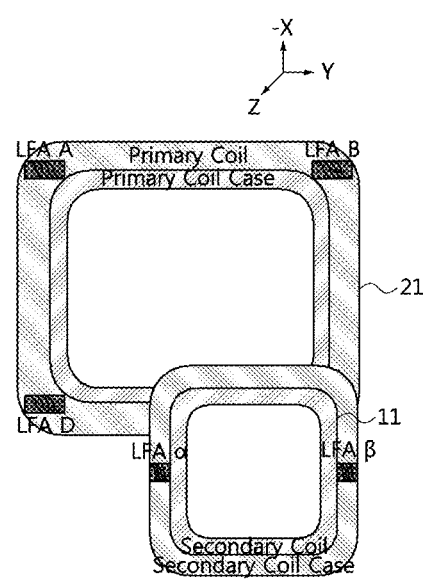
FIG. 7B is a diagram describing magnetic flux densities when a transmission coil and a reception coil are located within a very short distance according to another exemplary embodiment of the present disclosure.

FIG. 7B is a diagram describing magnetic flux densities when a transmission coil and a reception coil are located within a very short distance according to another exemplary embodiment of the present disclosure.

In this exemplary embodiment, a case where the LF transmitters of the reception coil emit the minimum value of the LF magnetic field at an arbitrary time point will be described.

Also, the magnetic flux densities detected by the LF antennas (i.e., LF antenna A, LF antenna B, LF antenna C, LF antenna D) of the transmission coil that receive the minimum value of the magnetic field emitted by the LF antenna α of the reception coil at time t2 may be expressed as shown in Equation 8 below.

$$\overline{B}(\text{LF antenna } A, t2) = \overline{B}\text{LF}AA, t2 \cdot \overline{B}\text{LF}A\alpha(\min), t2$$

$$\overline{B}(\text{LF antenna } B, t2) = \overline{B}\text{LF}AB, t2 \cdot \overline{B}\text{LF}A\alpha(\min), t2$$

$$\overline{B}(\text{LF antenna } C, t2) = \overline{B}\text{LF}AC, t2 \cdot \overline{B}\text{LF}A\alpha(\min), t2$$

$$\overline{B}(\text{LF antenna } D, t2) = \overline{B}\text{LF}AD, t2 \cdot \overline{B}\text{LF}A\alpha(\min), t2 \quad [\text{Equation 8}]$$

In addition, the magnetic flux densities detected by the LF antennas of the transmission coil that receive the minimum value of the magnetic field emitted by the LF antenna β of the reception coil at time t3 may be expressed as shown in Equation 9 below.

$$\overline{B}(\text{LF antenna } A, t3) = \overline{B}\text{LF}AA, t3 \cdot \overline{B}\text{LF}A\beta(\min), t3$$

$$\overline{B}(\text{LF antenna } B, t3) = \overline{B}\text{LF}AB, t3 \cdot \overline{B}\text{LF}A\beta(\min), t3$$

$$\overline{B}(\text{LF antenna } C, t3) = \overline{B}\text{LF}AC, t3 \cdot \overline{B}\text{LF}A\beta(\min), t3$$

$$\overline{B}(\text{LF antenna } D, t3) = \overline{B}\text{LF}AD, t3 \cdot \overline{B}\text{LF}A\beta(\min), t3 \quad [\text{Equation 9}]$$

Here, t2 is a time point at which each LF antenna of the transmission coil receives the magnetic field emitted by the LF antenna α of the reception coil, and t3 is a time point at which each LF antenna of the transmission coil receives the magnetic field emitted by the LF antenna β of the reception coil. Therefore, t2 and t3 may be different values, or may be the same value.

Finally, equations for RSSIs at each LF antenna (or, sensor) of the transmission coil, which are for measuring the distance between the transmission pad and the reception pad, may be summarized as shown in Equation 10 below.

$$\text{RSSI}\{(\overline{B}(\text{LF antenna } A, t0), \overline{B}(\text{LF antenna } B, t0), \overline{B}(\text{LF antenna } C, t0), \overline{B}(\text{LF antenna } D, t0)), (\overline{B}(\text{LF antenna } A, t1), \overline{B}(\text{LF antenna } B, t1), \overline{B}(\text{LF antenna } C, t1), \overline{B}(\text{LF antenna } D, t1))\}$$

$$\text{RSSI}\{(\overline{B}(\text{LF antenna } A, t2), \overline{B}(\text{LF antenna } B, t2), \overline{B}(\text{LF antenna } C, t2), \overline{B}(\text{LF antenna } D, t2)), (\overline{B}(\text{LF antenna } A, t3), \overline{B}(\text{LF antenna } B, t3), \overline{B}(\text{LF antenna } C, t3), \overline{B}(\text{LF antenna } D, t3))\} \quad [\text{Equation 10}]$$

Figure 8:
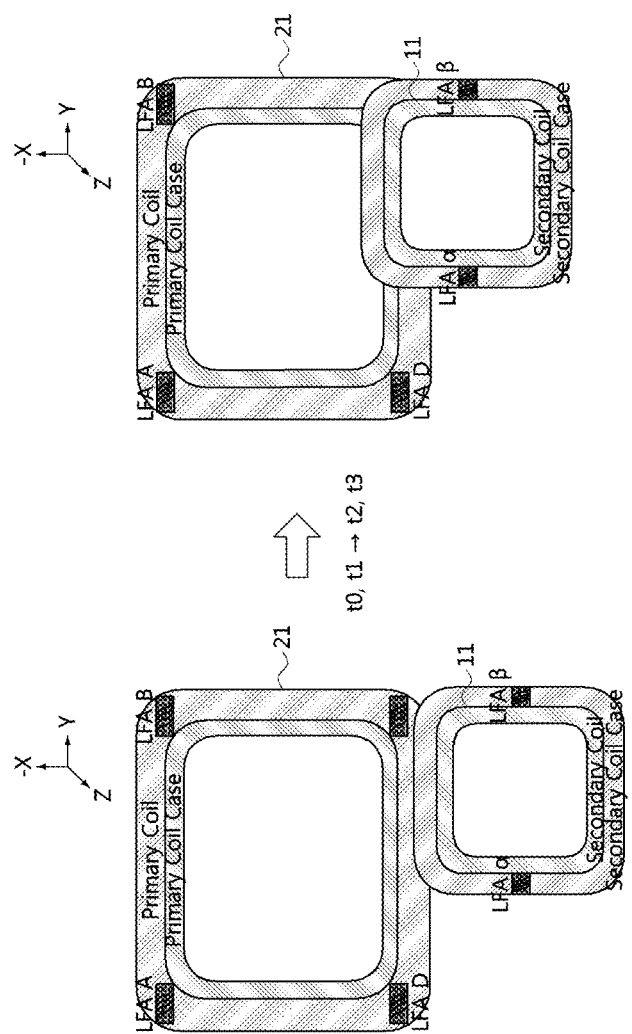
FIG. 8 is a diagram describing magnetic flux densities when a distance between a transmission coil and a reception coil is changed within a very close distance according to an exemplary embodiment of the present disclosure.

FIG. 8 is a diagram describing magnetic flux densities when a distance between a transmission coil and a reception coil is changed within a very close distance according to an exemplary embodiment of the present disclosure.

As shown in FIG. 8, when the transmission coil and the reception coil are in close proximity to each other, the maximum magnetic flux density emitted from the LF antenna of the reception coil for times t0 to t1 may be compared with the minimum magnetic flux density emitted by the LF antenna of the reception coil for times t2 to t3. As a result of the comparison, when a difference between the two values is less than a threshold, the corresponding magnetic flux density values may be excluded from data for the position measurement algorithm.

This may be expressed as shown in Equation 11 below.

$$\text{RSSI}\{(\overline{B}(\text{LF antenna } A, t0), \overline{B}(\text{LF antenna } B, t0), \cancel{\overline{B}(\text{LF antenna } C, t0)}, \overline{B}(\text{LF antenna } D, t0)), (\overline{B}(\text{LF antenna } A, t1), \overline{B}(\text{LF antenna } B, t1), \cancel{\overline{B}(\text{LF antenna } C, t1)}, \overline{B}(\text{LF antenna } D, t1))\}$$

$$\text{RSSI}\{(\overline{B}(\text{LF antenna } A, t2), \overline{B}(\text{LF antenna } B, t2), \cancel{\overline{B}(\text{LF antenna } C, t2)}, \overline{B}(\text{LF antenna } D, t2)), (\overline{B}(\text{LF antenna } A, t3), \overline{B}(\text{LF antenna } B, t3), \cancel{\overline{B}(\text{LF antenna } C, t3)}, \overline{B}(\text{LF antenna } D, t3))\} \quad [\text{Equation 11}]$$

Figure 9A:
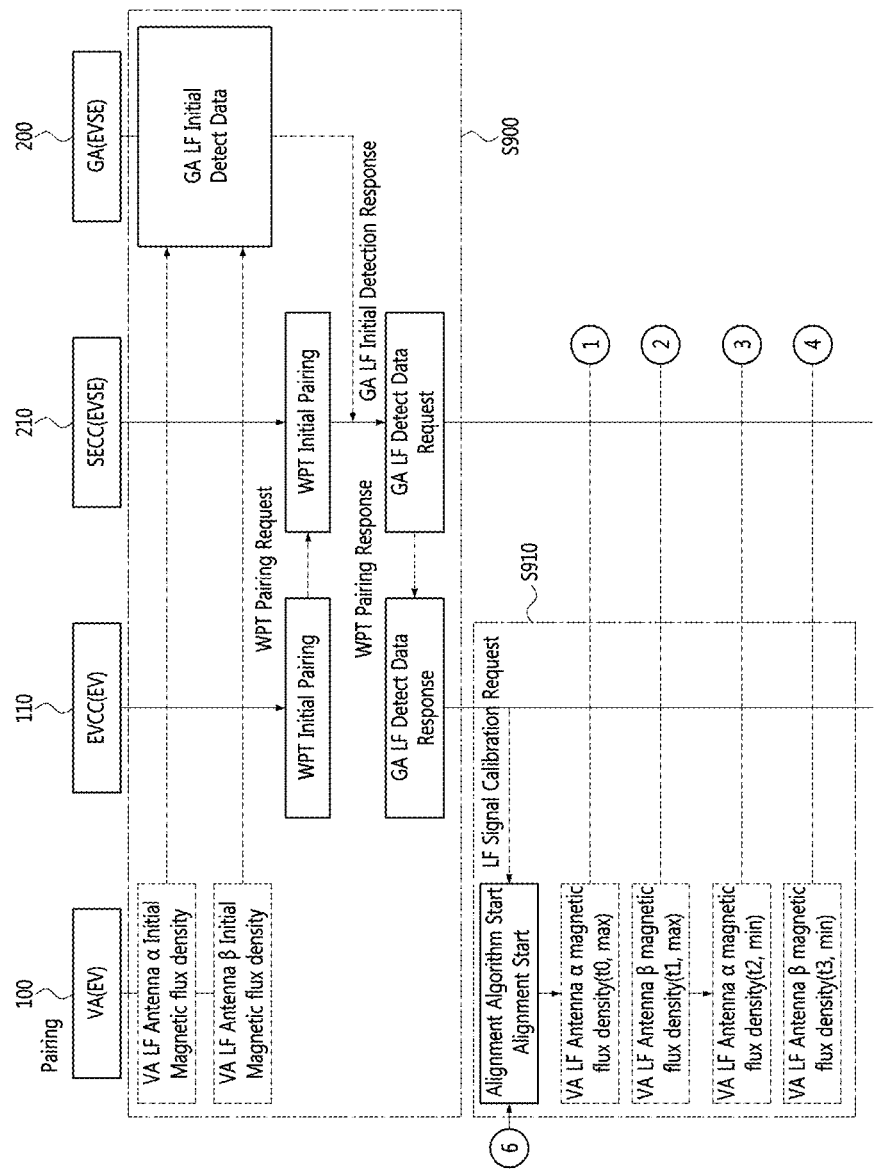
FIGS. 9A to 9C are sequence charts illustrating operations of a position alignment method according to an exemplary embodiment of the present disclosure.
Figure 9B:
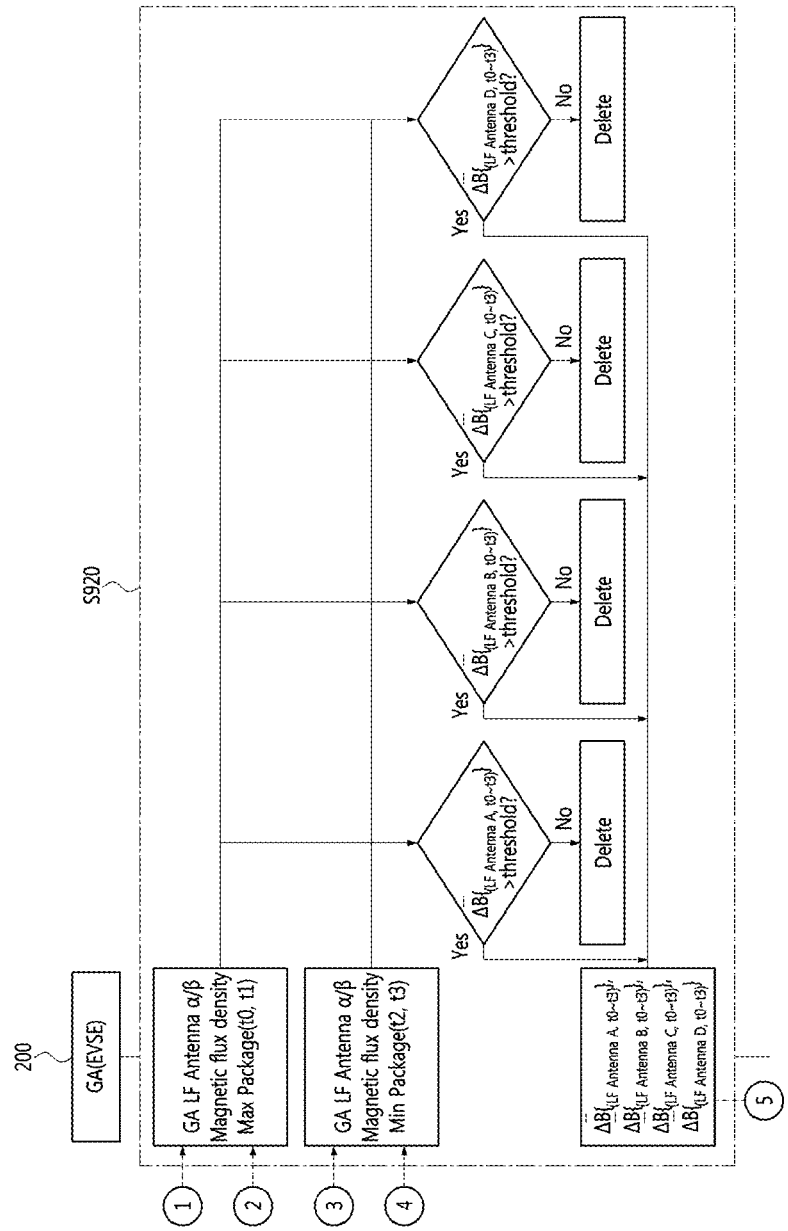
Figure 9C:
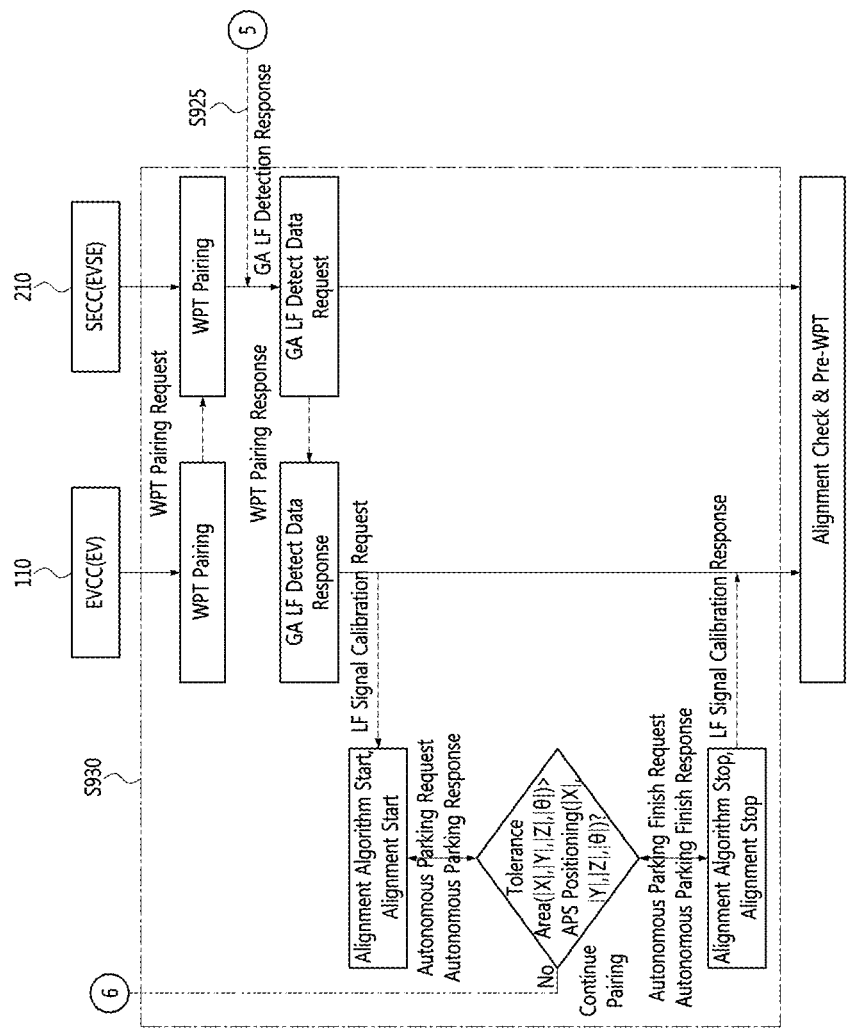

FIGS. 9A to 9C are sequence charts illustrating operations of a position alignment method according to an exemplary embodiment of the present disclosure.

The position alignment method illustrated in FIGS. 9A to 9C may include operations of an EVSE and a vehicle EV and a transmission and reception procedure performed therebetween.

As shown in FIG. 9A, the position alignment method according to the present disclosure may start with an initial detection procedure S900 of the LF magnetic field.

In the initial detection procedure of the LF magnetic field (S900), a VA 100 may emit an initial magnetic field using the LF transmitter, and an EVCC 110 of the vehicle may request a WPT initial pairing to an SECC 210. The SECC 210 notified that the LF signal is detected through the GA may transmit a GA LF detect data request to the EVCC 110 of the vehicle in response to the request of the initial pairing from the EVCC 110.

That is, in the initial detection procedure of the LF magnetic field (S900), the VA may initially emit an LF magnetic field through at least one LF transmitter, and a GA may receive the magnetic field emitted from the at least one LF transmitter of the VA.

The vehicle receiving the GA LF detect data request may perform an alignment procedure (S910). Here, the VA 100 may emit a magnetic field having a first magnetic flux density through at least one LF transmitter. The at least one LF transmitter may be two, for example, antenna α and antenna β. The antenna α may emit a magnetic field such that the corresponding magnetic flux density becomes the maximum value within a configuration range at time t0, and the antenna β may emit a magnetic field such that the corresponding magnetic flux density becomes the maximum value within a configuration range at time t1.

The VA 100 may then emit a magnetic field having a second magnetic flux density through at least one LF transmitter. Likewise, the at least one LF transmitters may be two, for example antenna α and antenna β. The antenna α may emit a magnetic field such that the corresponding magnetic flux density becomes the minimum value within a configuration range at time t2, and the antenna β may emit a magnetic field such that the corresponding magnetic flux density becomes the minimum value within a configuration range at time t3.

As shown in FIG. 9B, the GA 200 of the EVSE may detect the magnetic field emitted by the at least one LF transmitter of the VA (S920).

In the magnetic field detection step S920 by the GA 200, the GA 200 may measure a first magnetic flux density for the magnetic field emitted by at least one LF transmitter through at least one LF receiver. In this case, the at least one LF receiver may include four antennas, for example, LF antenna A, LF antenna B, LF antenna C, and LF antenna D. In this case, each of LF antenna A, LF antenna B, LF antenna C, and LF antenna D may detect the magnetic fields emitted by the transmitter α and the transmitter β. Here, the first magnetic flux density may be the maximum value of the magnetic flux density for the magnetic field transmitted by the at least one LF transmitter.

The GA 200 may also measure a second magnetic flux density for the magnetic field emitted by at least one LF transmitter through at least one LF receiver. Also in this case, the at least one LF receiver may include four antennas, for example, LF antenna A, LF antenna B, LF antenna C, and LF antenna D. That is, each of LF antenna A, LF antenna B, LF antenna C, and LF antenna D may detect the magnetic fields emitted by the transmitter α and the transmitter β. Here, the second magnetic flux density may be the minimum value of the magnetic flux density for the magnetic field transmitted by the at least one LF transmitter.

Then, the GA 200 may configure a received signal measurement based on a result of comparing the first magnetic flux density and the second magnetic flux density, and the received signal measurement may be a received signal strength indicator (RSSI).

That is, it may be determined whether a difference between the first magnetic flux density and the second magnetic flux density is greater than or equal to a threshold, and when the difference between the first magnetic flux density and the second magnetic flux density is less than the threshold, the first magnetic flux density and the second magnetic flux density may be excluded from the received signal measurement. In other words, the received signal measurement may include only magnetic flux density related data in which the difference between the first magnetic flux density and the second magnetic flux density is greater than or equal to the threshold.

The GA 200 may provide the configured received signal measurement to the vehicle 100 through the SECC 210 (S925).

As shown in FIG. 9C, the EV 100 receiving the received signal measurement may calculate a distance between the VA and the GA based on the received signal measurement, and the vehicle may execute automatic parking for position alignment according to the calculated distance (S930).

On the other hand, in the above-described exemplary embodiment, the distance between the VA and the GA is calculated on the vehicle side by using the measured magnetic field related values. However, the calculation of the distance may be calculated by the EVSE according to another exemplary embodiment of the present disclosure. In this case, the EVSE may provide the calculated distance to the vehicle so that the distance can be used for position alignment by the vehicle.

Figure 10:
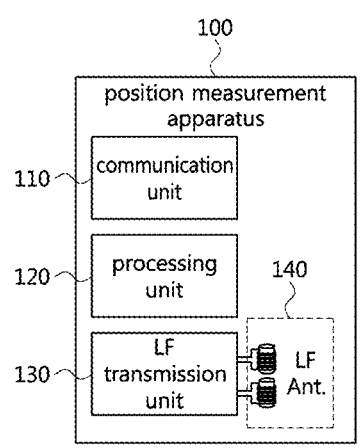
FIG. 10 is a block diagram illustrating a position measurement apparatus according to an exemplary embodiment of the present disclosure.

FIG. 10 is a block diagram illustrating a position measurement apparatus according to an exemplary embodiment of the present disclosure.

As shown in FIG. 10, a position alignment apparatus 100 according to an exemplary embodiment of the present disclosure may include a communication unit 110, a processing unit 120, an LF transmission unit 130, and at least one LF transmitter 140.

The position measurement apparatus 100 may be a VA or a part of the VA, or may be connected to the VA. That is, the component of the position measurement apparatus 100 is not limited to its name, and it may be defined by a function. Also, one component constituting the apparatus may perform a plurality of functions, and a plurality of components constituting the apparatus may perform one function.

The communication unit 110 may include a communication module capable of communicating with an EVSE 200 to be described later. Here, the communication module may include a communication module capable of performing WIFI communication, and may also include a communication module capable of performing 3G communication and 4G communication, but is not limited thereto. The communication unit 110 may search for a parking space where a GA is located through the communication module, communicate with the EVSE 200 connected to the GA for alignment between the GA and the VA, and receive magnetic field measurements from the EVSE 200.

Also, the communication unit 110 may measure at least one of a received signal strength indicator (RSSI), a time of flight (ToF), a time difference of flight (TDoF), and a time of arrival (ToA), and a time difference of arrival.

The processing unit 120 may verify whether at least one antenna connected to the LF transmission unit 130 to be described later is normally driven, drive the at least one antenna, and perform position alignment between the transmission pad and the reception pad by using the magnetic field measurements received through the communication unit 110.

The LF transmission unit 130 may verify whether the connected antenna is normally driven according to the operation of the processing unit 120, and may drive the at least one transmitter according to the present disclosure.

Also, the position measurement apparatus 100 according to an exemplary embodiment of the present disclosure may include at least one processor and a memory storing at least one instruction for executing the above-described operations through the at least one processor. Here, the processor may execute the at least one instruction stored in the memory, and may be a central processing unit (CPU), a graphics processing unit (GPU), or a dedicated processor executing the methods according to the exemplary embodiments of the present disclosure. The memory may be comprised of a volatile storage medium and/or a nonvolatile storage medium, and may be comprised of a read only memory (ROM) and/or a random access memory (RAM).

Here, the at least one instruction may be configured the processor to emit a magnetic field having a first magnetic flux density through at least one LF transmitter; emit a magnetic field having a second magnetic flux density through the at least one LF transmitter; receive a received signal measurement from the GA that detects the first magnetic flux density and the second magnetic flux density; and calculate a distance between the VA and the GA based on the received signal measurement.

The first magnetic flux density may be a maximum magnetic flux density for the magnetic field emitted from the at least one LF transmitter, and the second magnetic flux density may be a minimum magnetic flux density for the magnetic field emitted from the at least one LF transmitter.

The received signal measurement may include only data related to the first magnetic flux density and the second magnetic flux density which have a difference equal to or greater than a threshold.

The received signal measurement may be an RSSI, and the first magnetic flux density and the second magnetic flux density may be emitted at different time points.

The first magnetic flux density and the second magnetic flux density may be measured for each magnetic field emitted by the at least one LF transmitter by each of at least one LF receiver of the EVSE.

Figure 11:
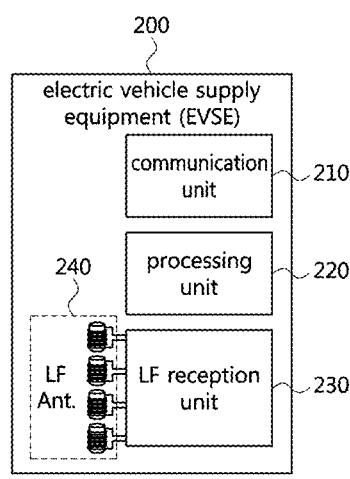
FIG. 11 is a block diagram illustrating an EVSE according to an exemplary embodiment of the present disclosure.

FIG. 11 is a block diagram illustrating an EVSE according to an exemplary embodiment of the present disclosure.

As shown in FIG. 11, an EVSE 200 according to an exemplary embodiment of the present disclosure may include a communication unit 210, a processing unit 220, and an LF reception unit 230.

The EVSE 200 may include a GA, or may be a GA itself. That is, the component of the EVSE 200 is not limited to its name, and it may be defined by a function. Also, one component constituting the apparatus may perform a plurality of functions, and a plurality of components constituting the apparatus may perform one function.

The communication unit 210 may include a communication module capable of communicating with the position measurement apparatus 100. Here, the communication module may include a communication module capable of performing WIFI communication, and may also include a communication module capable of performing 3G communication and 4G communication, but is not limited thereto.

Also, the communication unit 210 may be connected to the position measurement apparatus 100 for alignment between the GA and the VA, and may transmit measurements of received signals, which are configured according to the present disclosure, to the position measurement apparatus 100.

The processing unit 220 may derive the magnetic field measurements based on information on magnetic fields detected by the LF reception unit 230 to be described later. Here, the information on the magnetic fields may exist for each antenna. The processing unit 220 may provide the magnetic field measurements to the communication unit 210.

The LF reception unit 230 may be connected to a plurality of, for example, four receiving antennas located in the GA, and obtain information on magnetic fields emitted by the two transmitters of the position measurement apparatus 100, which are detected by the four receiving antennas. The LF reception unit 230 may provide the processing unit 220 with the obtained information on the magnetic fields.

Also, the EVSE 200 according to an exemplary embodiment of the present disclosure may include at least one processor and a memory storing at least one instruction for executing the above-described operations through the at least one processor. Here, the processor may execute the at least one instruction stored in the memory, and may be a central processing unit (CPU), a graphics processing unit (GPU), or a dedicated processor executing the methods according to the exemplary embodiments of the present disclosure. The memory may be comprised of a volatile storage medium and/or a nonvolatile storage medium, and may be comprised of a read only memory (ROM) and/or a random access memory (RAM).

The at least one instruction may be configured the processor to measure, through at least one LF receiver of the GA, a first magnetic flux density for a magnetic field emitted from at least one LF transmitter of a VA; measure, through the at least one LF receiver, a second magnetic flux density for a magnetic field emitted from the at least one LF transmitter; configure a received signal measurement based on a comparison result of the first magnetic flux density and the second magnetic flux density; and provide the configured received signal measurement to a vehicle.

While some aspects of the present disclosure have been described in the context of an apparatus, it may also represent a description according to a corresponding method, wherein the block or apparatus corresponds to a method step or a feature of the method step. Similarly, aspects described in the context of a method may also be represented by features of the corresponding block or item or corresponding device. Some or all of the method steps may be performed by (or using) a hardware device such as, for example, a microprocessor, a programmable computer, or an electronic circuit. In various exemplary embodiments, one or more of the most important method steps may be performed by such an apparatus.

In exemplary embodiments, a programmable logic device (e.g., a field programmable gate array (FPGA)) may be used to perform some or all of the functions of the methods described herein. In addition, the FPGA may operate in conjunction with a microprocessor to perform one of the methods described herein. Generally, the methods are preferably performed by some hardware device.

While the exemplary embodiments of the present disclosure and their advantages have been described in detail, it should be understood that various changes, substitutions, and alterations may be made herein without departing from the scope of the present disclosure.

What is claimed is:

1. A position alignment method performed by a ground assembly (GA) for wireless power transfer, the position alignment method comprising:
   measuring, through at least one low frequency (LF) receiver of the GA, a first magnetic flux density for a magnetic field emitted from at least one LF transmitter of a vehicle assembly (VA);
   measuring, through the at least one LF receiver, a second magnetic flux density for a magnetic field emitted from the at least one LF transmitter;
   configuring a received signal measurement based on a comparison result of the first magnetic flux density and the second magnetic flux density; and
   providing the configured received signal measurement to a vehicle,
   wherein the first magnetic flux density is a maximum magnetic flux density for the magnetic field emitted from the at least one LF transmitter, and the second magnetic flux density is minimum magnetic flux density for the magnetic field emitted from the at least one LF transmitter.

2. The position alignment method according to claim 1, wherein the configuring of the received signal measurement comprises:
   determining whether a difference between the first magnetic flux density and the second magnetic flux density is greater than or equal to a threshold; and
   excluding the first magnetic flux density and the second magnetic flux density from the received signal measurement when the difference between the first magnetic flux density and the second magnetic flux density is less than the threshold.

3. The position alignment method according to claim 1, wherein the received signal measurement is a received signal strength indicator (RSSI).

4. The position alignment method according to claim 1, wherein the first magnetic flux density and the second magnetic flux density are measured at different time points by the at least one LF receiver.

5. The position alignment method according to claim 1, further comprising initially detecting a magnetic field emitted from the at least one LF transmitter of the VA.

6. A position measurement method performed by a vehicle assembly (VA) for wireless power transfer, the position measurement method comprising:
emitting a magnetic field having a first magnetic flux density through at least one low frequency (LF) transmitter;
emitting a magnetic field having a second magnetic flux density through the at least one LF transmitter;
receiving a received signal measurement from a ground assembly (GA) that detects the first magnetic flux density and the second magnetic flux density; and
calculating a distance between the VA and the GA based on the received signal measurement,
wherein the first magnetic flux density is a maximum magnetic flux density for the magnetic field emitted from the at least one LF transmitter, and the second magnetic flux density is minimum magnetic flux density for the magnetic field emitted from the at least one LF transmitter.

7. The position measurement method according to claim 6, wherein the received signal measurement includes only data related to the first magnetic flux density and the second magnetic flux density which have a difference equal to or greater than a threshold.

8. The position measurement method according to claim 6, wherein the received signal measurement is a received signal strength indicator (RSSI).

9. The position measurement method according to claim 6, wherein the first magnetic flux density and the second magnetic flux density are emitted at different time points.

10. The position measurement method according to claim 6, further comprising initially emitting a magnetic field through the at least one LF transmitter.

11. A position measurement apparatus comprising:
at least one low frequency (LF) transmitter;
a communication module configured to receive a received signal measurement from a ground assembly (GA) that detects the first magnetic flux density and the second magnetic flux density; and
a processor configured to control the LF transmitter to emit a magnetic field having a first magnetic flux density and to emit a magnetic field having a second magnetic flux density, and calculate a distance between a vehicle assembly (VA) and the GA based on the received signal measurement,
wherein the first magnetic flux density is a maximum magnetic flux density for the magnetic field emitted from the at least one LF transmitter, and the second magnetic flux density is minimum magnetic flux density for the magnetic field emitted from the at least one LF transmitter.

12. The position measurement apparatus according to claim 11, wherein the received signal measurement includes only data related to the first magnetic flux density and the second magnetic flux density which have a difference equal to or greater than a threshold.

13. The position measurement apparatus according to claim 11, wherein the received signal measurement is a received signal strength indicator (RSSI).

14. The position measurement apparatus according to claim 11, wherein the first magnetic flux density and the second magnetic flux density are emitted at different time points.

15. The position measurement apparatus according to claim 11, wherein the processor is further configured to control the LF transmitter to initially emit a magnetic field.

16. The position measurement apparatus according to claim 11, wherein the first magnetic flux density and the second magnetic flux density are measured for each magnetic field emitted by the at least one LF transmitter by each of at least one LF receiver of an electric vehicle supply equipment (EVSE).

17. The position measurement apparatus according to claim 11, wherein the LF receiver is an LF antenna or an LF sensor.

* * * * *